US006344814B1

(12) United States Patent
Lin et al.

(10) Patent No.: US 6,344,814 B1
(45) Date of Patent: Feb. 5, 2002

(54) DRIVING CIRCUIT

(75) Inventors: Shi-Tron Lin, Taipei; Yung-Peng Hwang, Hsinchu, both of (TW)

(73) Assignee: Winbond Electronics Corporation, Winbond ( * ) Notice: Subject to any disclaimer, the term of this patent is extended or adjusted under 35 U.S.C. 154(b) by 0 days.

(21) Appl. No.: 09/458,022

(22) Filed: Dec. 10, 1999

(51) Int. Cl.[7] .................................................. H03M 1/66

(52) U.S. Cl. ......................... 341/144; 341/333; 341/530

(58) Field of Search ................................. 341/144, 145, 341/117, 136, 133, 150; 327/530, 333, 330; 340/784; 345/204, 98

(56) References Cited

U.S. PATENT DOCUMENTS 4,714,921 A 12/1987 Kanno et al.
4,845,488 A 7/1989 Kelly
4,955,696 A 9/1990 Taniguchi et al.
5,120,991 A 6/1992 Takahashi
5,168,270 A 12/1992 Masumori et al.
5,170,155 A 12/1992 Plus et al.
5,170,158 A 12/1992 Shinya
5,192,945 A * 3/1993 Kusada ........................ 340/784
5,196,738 A * 3/1993 Takahara et al. ......... 307/296.1
5,283,565 A 2/1994 Suzuki et al.
5,510,748 A * 4/1996 Erhart et al. ................ 327/530
5,578,957 A 11/1996 Erhart et al.
5,754,156 A * 5/1998 Erhart et al. .................. 345/98
6,008,801 A * 12/1999 Jeong ......................... 345/204

* cited by examiner

*Primary Examiner*—Brian Young
*Assistant Examiner*—John Nguyen
(74) *Attorney, Agent, or Firm*—Finengan, Henderson, Farabow, Garrett & Dunner, L.L.P.

(57) ABSTRACT

A driving circuit suitable for driving pixels in an LCD array includes dual channel digital-to-analog converters (DACs). Each dual channel DAC outputs on channel A and channel B outputs the analog version of an applied digital signal and a non-passing voltage, respectively, and switches these outputs in response to a toggle signal. The DAC outputs are applied to paired output transistors such that one transistor of each transistor pair is rendered conductive and the other transistor is rendered non-conductive during each display cycle. By designating alternate DACs to receive upper and lower voltage range driving voltages, respectively, each pixel is alternately driven by voltages in the upper and lower voltage range and the driving voltage range applied to each pixel in one display cycle is opposite to the voltage range applied to the immediately adjacent pixels in the same display cycle.

49 Claims, 4 Drawing Sheets

DRIVING CIRCUIT

BACKGROUND OF THE INVENTION

1. Field of the Invention

The present invention relates generally to a driving circuit for outputting a driving voltage and, more particularly, to a driving circuit that outputs voltages in alternating driving voltage ranges.

2. Description of the Related Art

A conventional liquid crystal display (LCD) comprises an array of pixels arranged in rows and columns. The image information displayed at each pixel, e.g., a shade of grey or color, is controlled by the magnitude of a driving voltage applied thereto. The LCD is typically driven by enabling one row of pixels of the display, at one time, and applying driving voltages to the respective columns of pixels. This process is repeated for each row of the display to generate a complete displayed image. The entire process is periodically repeated to updated the displayed image.

In accordance with current designs of LCDs, it is desirable to apply a driving voltage to each pixel in a relatively large voltage range, e.g., 0–12 volts. Theoretically, in order for a driving circuit constructed of MOSFETs to be capable of outputting driving voltages over such a range, the individual transistors would need to be designed to tolerate the highest output voltage, e.g., 12 volts. This would result in the transistors each being relatively physically large to provide tolerance to an output voltage that the transistors are only occasionally subjected to during operation. Also, disadvantageously, the larger size of these transistors results in the circuitry into which they are integrated to take up more physical space. Such additional physical space generally equates with additional cost and size for the LCD driving circuit.

One solution to the problems created by the use of MOSFETs sized to tolerate the full range of driving voltage is to limit the range of voltage to which each individual transistor in the driving circuit is subjected. One way this has been accomplished is by limiting the voltages applied across the gate oxides of the driving transistors to be less than a gate oxide breakdown voltage. More particularly, this is achieved for each driving transistor by selecting a fixed voltage for application to its gate terminal to result in the voltage across the gate oxide being less than the gate oxide breakdown voltage. However, in order to implement this arrangement in a driving circuit with a large output voltage range, it is necessary to divide the desired driving voltage range into at least two portions and provide at least two MOSFETs respectively associated with the two portions.

It is desirable in some LCD applications to apply to individual pixels a driving voltage that alternates between voltages respectively having magnitudes in upper and lower voltage ranges. This alternation of voltage magnitude is carried out in order to achieve an improved displayed image quality. The alternating voltage magnitudes can be applied to pixels such that in each display cycle any two adjacent pixels in a row respectively have applied to them voltages in the upper and lower voltage ranges. The voltages can also be applied such that in each display cycle any two pixels in both the row and column directions respectively have applied thereto the voltages in the upper and lower voltage ranges.

In conventional practice it has been necessary to couple the desired driving voltages to each pixel through multiplexer circuitry. Such multiplexer circuitry undesirably increases circuit complexity and slows down LCD operation. Further, the conventional practice of providing a multiplexer to alternately select the outputs of a pair of digital-to-analog converters (DACs) outputting voltages in the upper and lower voltage ranges for application to a pair of LCD columns results in unequal signal path routing lengths between the DACs and the LCD columns, which further limits the operating speed of the LCD driving circuit.

SUMMARY OF THE INVENTION

Accordingly, the present invention is directed to a driving circuit that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the method and apparatus particularly pointed out in the written description and claims hereof as well as the appended drawings. To achieve these and other advantages and in accordance with the purpose of the invention, as embodied and broadly described, the invention is directed to a driving circuit for outputting driving signals from an array of digital-to-analog converters to an array of output terminals. The driving circuit comprises first and second output terminals; a first digital-to-analog converter (DAC) for outputting analog voltages in a first voltage range; a second DAC for outputting analog voltages in a second voltage range; and a third DAC for outputting analog voltages in the second voltage range. The first and second output terminals are coupled to receive a first analog voltage from the first DAC and a second analog voltage from the second DAC, respectively, during a first time cycle, and the first and second output terminals are coupled to receive a third analog voltage from the third DAC and a fourth analog voltage from the first DAC, respectively, during a second time cycle.

Also in accordance with the present invention there is provided a method for outputting an array of alternating high-range and low-range driving signals from an array of digital-to-analog converters (DACs) to an array of output terminals including at least first and second output terminals. The method comprises: defining successive alternating first and second time cycles; outputting, during the first time cycle, a first analog voltage in a first voltage range from a first DAC of the array of DACs to the first output terminal; outputting, during the first time cycle, a second analog voltage in a second voltage range from a second DAC of the array of DACs to the second output terminal; outputting, during the second time cycle, a third analog voltage in the second range from a third DAC of the array of DACs to the first output terminal; and outputting, during the second time cycle, a fourth analog voltage in the first range from the first DAC to the second output terminal.

Further in accordance with the present invention there is provided a digital-to-analog converter for converting into an analog output a digital input value, comprising: a decoder for receiving the digital input value and providing decoded bits; first and second sets of logic gates respectively coupled to receive the decoded bits on a first input; a first set of output transistors each having a conductive state controlled by an output of a corresponding one of the first set of logic gates; a second set of output transistors each having a conductive state controlled by an output of a corresponding one of the second set of logic gates; an inverter coupled to receive an externally applied binary signal on its input and provide an inversion of the binary signal on its output; the first set of logic gates coupled to receive the output of the inverter on a second input; the second set of logic gates coupled to receive the binary signal on a second input; an array of analog voltage nodes; a first output terminal; a second output terminal; the first set of output transistors each coupled between the first output terminal and predetermined points along said array of analog voltage nodes; the second set of output transistors each coupled between the second output terminal and the predetermined points along said array of analog voltage nodes; a first shunting transistor coupled between a first node for receiving a first power supply voltage and the first output terminal and having a conductive state controlled by the inverter output; and a second shunting transistor coupled between the first node and the second output terminal and having a conductive state controlled by the binary signal.

Additionally in accordance with the present invention there is provided a digital-to-analog converter for converting into an analog output a digital input value, comprising: a decoder for receiving the digital input value and providing decoded bits; a set of output transistors each having a conductive state controlled by a different one of the decoded bits; an array of analog voltage nodes; a selector circuit having first and second inputs and first and second outputs and coupled to receive a digital control signal, the selector circuit providing on the first and second outputs voltages on the first and second inputs, respectively, or the second and first inputs, respectively, depending on whether the digital signal has a first or second value, respectively; the set of output transistors each coupled between the first input and said array of analog voltage nodes; and the second input coupled to another node corresponding to a non-passing voltage.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate embodiments of the invention, and together with the description serve to explain principles of the invention.

DETAILED DESCRIPTION OF THE PREFERRED EMBODIMENTS

Figure 1:
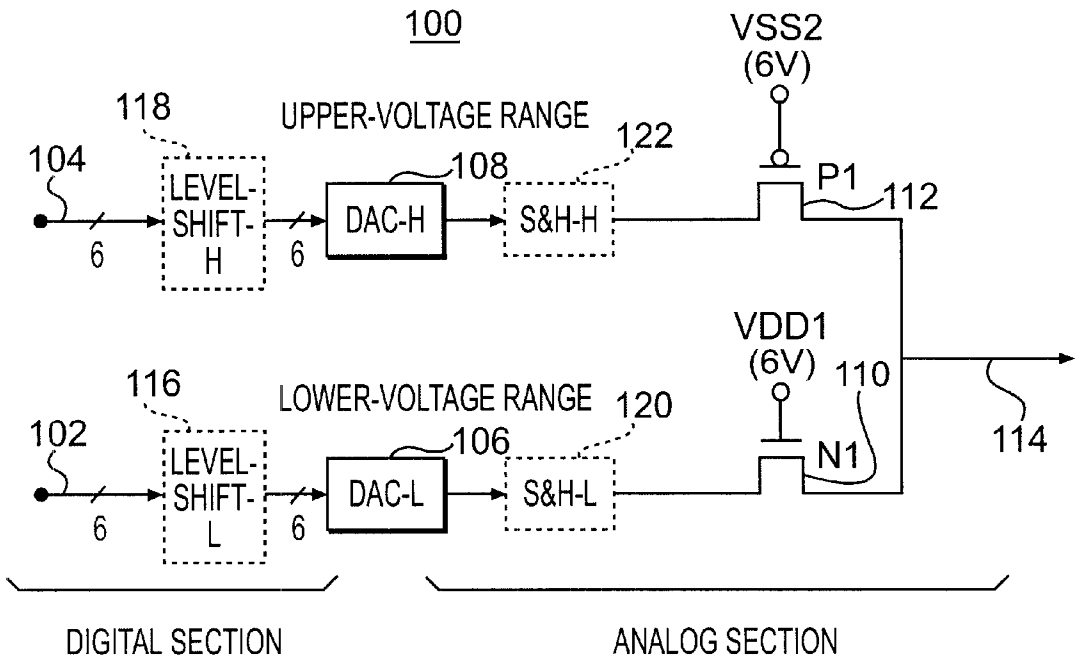
FIG. 1 illustrates a driving circuit constructed in accordance with a first embodiment of the invention.

FIG. 1 illustrates a driving circuit 100 constructed according to a first embodiment of the present invention. Circuit 100 is coupled to received digital values representative of desired output driving voltages in a desired range, e.g., 0–12 volts. Driving circuit 100 is suitable for outputting driving voltages for driving pixels of an LCD. The range of output driving voltages is divided into upper and lower voltage ranges which preferably are the upper and lower halves of the voltage range, although the range need not be evenly divided. Thus, in the present example, the lower range is 0 to 6 volts, designated herein as VSS1 to VDD1, respectively, and the upper range is 6 to 12 volts, designated here as VSS2 to VDD2, respectively. Circuit 100 is coupled to receive on an input 102 a first digital input value that corresponds to a driving voltage in the lower voltage range. Similarly, circuit 100 is coupled to receive on an input 104 a second digital input value that corresponds to a driving voltage in the upper voltage range. As shown in FIG. 1, the digital input values may each consist of 6-bit data.

The digital value on input 102 is applied to a digital-to-analog converter (DAC) 106 for converting to analog values the digital input values in the lower voltage range. Similarly, the digital input on input 104 is applied to a DAC 108 for converting to analog values the digital input values in the upper voltage range. The analog outputs of DACs 106 and 108 are respectively applied to driving transistors 110 and 112. The outputs of transistors 110 and 112 are coupled to an output terminal 114.

Circuit 100 can optionally include a level shift circuit 116 coupled between input 102 and DAC 106 and a level shift circuit 118 coupled between input 104 and DAC 108. Level shift circuits 116 and 118 would be included in driving circuits in which it is desirable to shift the digital input values to different voltage ranges. For example, level shift circuits may be used to shift digital values to a voltage range for which the associated DAC is adapted.

Circuit 100 can also optionally include a sample and hold circuit 120 coupled between DAC 106 and transistor 110 and a sample and hold circuit 122 coupled between DAC 108 and transistor 112. Sample and hold circuits 120 and 122 would be included in driving circuits in which there is a need to boost the driving strength or to stably hold the analog output values of DACs 106 and 108 while driving output loads, respectively.

Transistors 110 and 112 are preferably provided as MOSFETs. Transistors 110 and 112 are further preferably provided as an n-channel MOSFET (NMOS) and a p-channel MOSFET (PMOS), respectively, that constitute a CMOS pair. The gate terminals of transistors 110 and 112 are respectively coupled to receive predetermined voltages VDD1 and VSS2. In the present example, VDD1=VSS2=6 volts. However, these voltages need not be equal, so that in a variation of the present example, these two voltages could be different, e.g., respectively provided as 6.2 and 5.8 volts or vice versa.

More generally, the voltages applied to the gates and inputs of transistors 110 and 112 are selected so that the voltage across the gate oxide of either transistor never exceeds a voltage withstand capability, which is 6 volts in the present example, and so that transistors 110 and 112 can be rendered selectively conductive in a manner more fully described below. More particularly, transistor 110 is coupled to receive the analog output value from DAC 106 which is in the lower voltage range of 0–6 volts for conducting to output terminal 114, and transistor 112 is coupled to receive the analog output value from DAC 108 which is in the upper voltage range of 6–12 volts for conducting to output terminal 114. Further, when one of transistors 110 and 112 receives a voltage to conduct to output terminal 114, the other transistor receives from its associated DAC a non-passing voltage that renders it non-conductive. Since the voltage on output terminal 114 can range within 0–12 volts, the 6 volt withstand capabilities of transistors 110 and 112 are not exceeded. Thus, the digital values applied to driving circuit 100 may be adapted such that during a display cycle the digital value applied to one of DACs 106 and 108 corresponds to a non-passing voltage while the digital value applied to the other DAC is to be converted to analog form and conducted to output terminal 114. Alternatively, as described below, each DAC can be constructed to be responsive to a control signal to selectively generate a non-passing voltage regardless of the digital value applied thereto.

In operation, the first and second digital input values applied to input terminals 102 and 104 of circuit 100 are selected so that one of transistors 110 and 112 conducts the corresponding analog voltage and the other of transistors 110 and 112 is rendered non-conductive. For example, if it is desired to output a driving voltage, e.g., 9.5 volts, in the upper voltage range, the digital value corresponding to that desired input voltage is applied to input terminal 104. DAC 108 outputs in analog form the desired output voltage for application to transistor 112. Transistor 112 outputs the desired voltage on output terminal 114. At the same time, a digital value corresponding to an analog voltage that will not be conducted by transistor 110, i.e., a non-passing voltage, is applied to input 102. DAC 106 outputs in analog form the non-passing voltage. With the threshold voltage of transistor 110 designated VT1, as long as the non-passing voltage is at least in a range of VDD1−VT1 to VDD1+VT1 or, more generally is VDD1−VT1 or greater and if the output voltage present on output terminal 114 is greater than or equal to VDD1−VT1, transistor 110 will be non-conductive. Thus, in the present example, if transistor 110 has a threshold value of 0.8 volts, and VDD1=6 volts, then as long as the non-passing voltage is in the range of 5.2 and 6.8 volts or, more generally, greater than or equal to 5.2 volts, and the voltage present on output terminal 114 is greater than or equal to 5.2 volts, transistor 110 will be non-conductive. More particularly, since the source and drain potential of NMOS transistor 110 are both higher than VDD1−VT1, the transistor is naturally turned off without any analog switching.

As a further example, if it is desired to output a driving voltage, e.g., 2.5 volts, in the lower voltage range, the digital value corresponding to that desired voltage is applied to input terminal 102. DAC 106 outputs in analog form the desired output voltage for application to transistor 110 and transistor 110 outputs the desired voltage on output terminal 114. At the same time, a digital value corresponding to a non-passing voltage that will not be conducted by transistor 112 is applied to input 104. DAC 108 outputs in analog form the non-passing voltage. With the threshold voltage of transistor 112 designated VT2, as long as the non-passing voltage is at least in a range of VSS2−|VT2| to VSS2+|VT2| or, more generally is VSS2+|VT2| or less and if the output voltage present on output terminal 114 is less than or equal to VSS2+|VT2|, transistor 112 will be non-conductive. Thus in the present example, if transistor 112 has a threshold voltage of −0.9 volts and VSS2=6 volts, then as long as the non-passing voltage is in the range of 5.1 to 6.9 volts or, more generally, less than or equal to 6.9 volts, and the voltage present on output terminal 114 is less than or equal to 6.9 volts, transistor 112 will be non-conductive. More particularly, since the source and drain potentials of PMOS transistor 112 are both less than VSS2+|VT2|, the transistor is naturally turned off without any analog switching. Under the conditions of the present embodiment, transistor 110 will conduct voltages in the range of approximately 1 to 5 volts and transistor 112 will conduct voltages in the range of approximately 7 to 11 volts. These voltage ranges represent suitable values for driving an LCD.

With respect to the non-passing voltages generated by DACs 106 and 108, each of these DACs can be constructed to provide the desired analog non-passing voltage in response to a predetermined digital input value. For example, in the case of 6-bit digital data, each of DACs 106 and 108 can be constructed to output a non-passing voltage in response to the digital input value "111111" corresponding to the decimal value 64.

Further by alternately applying digital input values in the upper and lower voltage ranges in successive operating cycles, e.g., successive display cycles of an LCD, driving circuit 100 can be operated to provide on its output an analog driving voltage that alternates between the upper and lower voltage ranges in successive operating cycles.

In the described operation of circuit 100, the gate oxide of each of transistors 110 and 112 is subjected to no more than 6 volts gate-to-source or gate-to-drain. Thus, each of transistors 110 and 112 can be constructed to withstand 6 volts while being implemented in a driving circuit having an output voltage range of 0–12 volts. Further, since circuit 100 does not include any kind of output control circuit or multiplexer for selecting between the respective analog outputs of DACs 110 and 112, the desired analog output is conducted without delay to output terminal 114. As a result, the operating speed of circuit 100 is faster than that of conventional driving circuits. Further, in view of the lower withstand voltage and absence of output control or multiplexer circuit, the driving circuit requires less space and thus promotes more compact circuitry and reduced cost.

While voltage ranges of 0 to 6 volts and 6 to 12 volts have been illustrated, driving circuit 100 can be constructed for different voltage ranges. For example, circuit 100 can be constructed to provide an output voltage range of 0 to 10 volts. In such an implementation, the lower and upper voltage ranges could be, for example, 0 to 5 volts and 5 to 10 volts, respectively. Further, voltage VDD1 applied to the gate of NMOS transistor 110 would be 6 volts and the non-passing voltage for application to transistor 110 would be 6 volts. The voltage VSS2 applied to the gate of PMOS transistor 112 would be 4 volts and the non-passing voltage for application to transistor 112 would be 4 volts. The threshold voltages VT1 and |VT2| would be about 1 volt. More generally, with respect to selecting transistors for constructing circuit 100, the threshold voltage of each transistor depends on the source voltage when the transistor is conducting.

Figure 2:
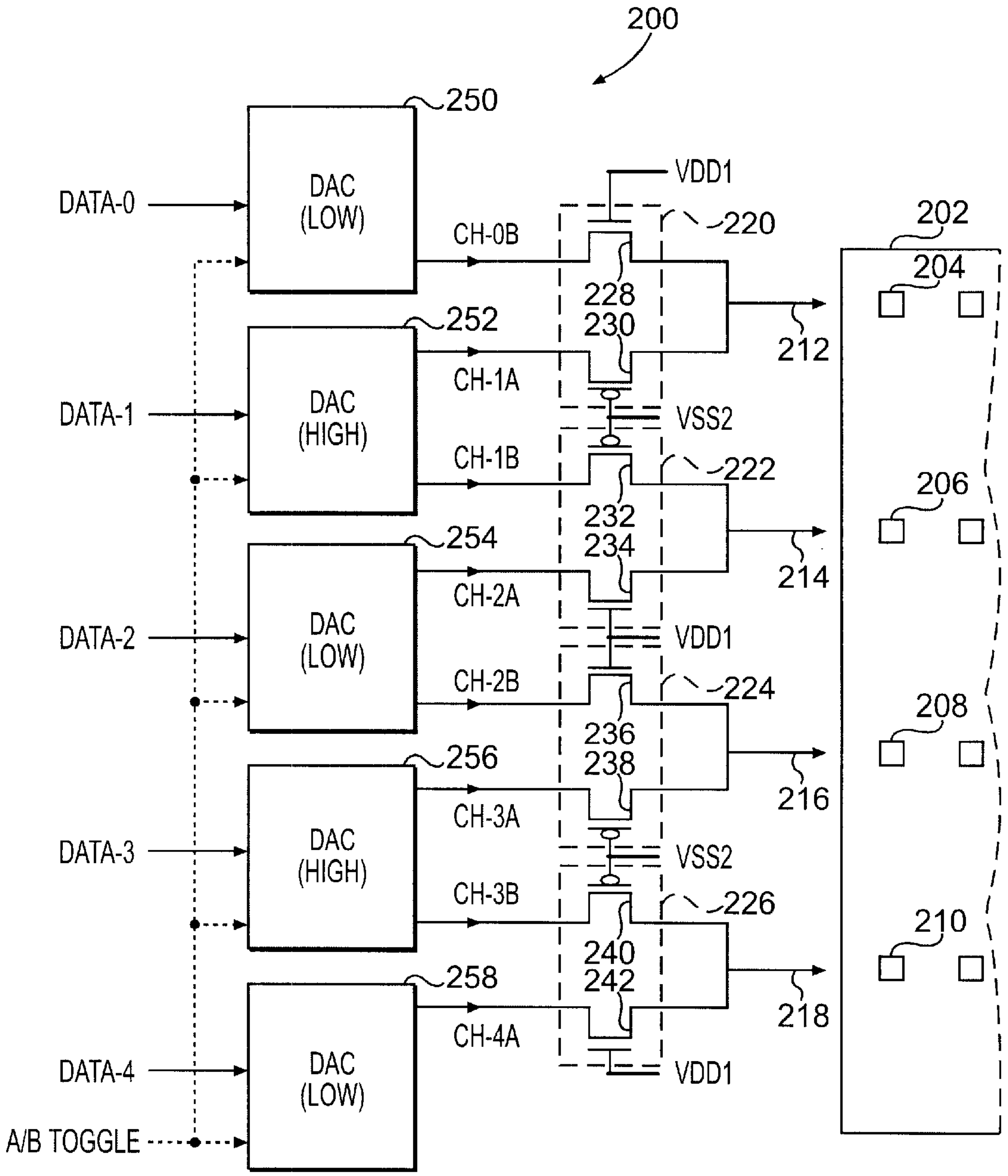
FIG. 2 illustrates a driving circuit constructed in accordance with a second embodiment of the invention.

FIG. 2 illustrates a driving circuit 200 constructed in accordance with a second embodiment of the present invention, for driving an array of pixels in an LCD 202. For convenience of explanation, LCD 202 is diagrammatically illustrated as including four pixels 204, 206, 208, and 210 that are driven by driving voltages provided on outputs 212, 214, 216, and 218, respectively, of driving circuit 200, to control the gray shade or color of the pixels. Pixels 204–210 are adjacent pixels, e.g., adjacent pixels in one row of the array of pixels included in LCD 200. Thus, in accordance with an aspect of the present invention, driving circuit 200 is adapted to provide a driving voltage on each of outputs 212–218 that alternates between values in the upper and lower voltage ranges and such that when the voltage applied to one pixel is in the upper or lower voltage range, the voltage applied to each pixel adjacent to that pixel is in the lower or upper voltage range, respectively.

Driving circuit 200 includes output driving transistor pairs 220, 222, 224, and 226. Pair 220 consists of NMOS transistor 228 and PMOS transistor 230. Pair 222 consists of PMOS transistor 232 and NMOS transistor 234. Pair 224 consists of NMOS transistor 236 and PMOS transistor 238.

Pair 228 consists of PMOS transistor 240 and NMOS transistor 242. The gate of each NMOS transistor is connected to receive voltage VDD1, which in the present embodiment is six volts, and the gate of each PMOS transistor is connected to receive voltage VSS2, which in the present embodiment is six volts. The outputs of transistors 228 and 230 are coupled together to output 212. The outputs of transistors 232 and 234 are coupled together to output 214. The outputs of transistors 236 and 238 are coupled together to output 216. The outputs of transistors 240 and 242 are coupled together to output 218.

Circuit 200 also includes dual channels DACs 250, 252, 254, 256, and 258, respectively coupled to receive digital input values DATA-0, DATA-1, DATA-2, DATA-3, and DATA-4. Each of DACs 250, 254, and 258 are preferably constructed to receive and convert to analog form a digital input value in the lower voltage range. Thus, each of data input values DATA-0, DATA-2, and DATA-4 correspond to voltages in the lower voltage range. Each of DACs 252 and 256 are preferably constructed to receive and convert to analog form a digital input value in the upper voltage range. Thus, each of data input values DATA-1 and DATA-3 correspond to voltages in the upper voltage range.

Each of DACs 250–258 is a dual channel DAC in that each DAC includes digital-to-analog conversion circuitry for providing an analog voltage output corresponding to the digital value applied thereto, on either of two analog outputs. For convenience, each DAC is described as having an "A" channel output and a "B" channel output and the dual channel outputs of each DAC are illustrated in FIG. 2 with numerical references that correspond to the applied digital input value. For example, the dual channel analog outputs of DAC 254 which receives digital input value DAC-2 are Ch-2A and Ch-2B.

Since DAC 250 is only provided for driving a first of the adjacent pixels, i.e., pixel 204, it is only necessary that DAC 250 be provided as a single channel DAC. However, for convenience, DAC 250 can also be provided as a dual channel DAC and it is illustrated with its output Ch-0B. Similarly, DAC 258 is only provided for driving a last of the adjacent pixels, i.e., pixel 210, so that it is only necessary that DAC 258 be provided as a single channel DAC. However, for convenience, DAC 258 can also be provided as a dual channel DAC and it is illustrated with its output Ch-4A.

The respective DACs with dual channel outputs each have their respective dual outputs connected to transistors of different ones of the output driving transistor pairs. Thus, the channel 1A and 1B outputs of DAC 252 are respectively connected to the inputs of transistors 230 and 232 that respectively correspond to transistor pairs 220 and 222. The channel 2A and 2B outputs of DAC 254 are respectively connected to the inputs of transistors 234 and 236 that respectively correspond to transistor pairs 222 and 224. The channel 3A and 3B outputs of DAC 256 are respectively connected to the inputs of transistors 238 and 240 that respectively correspond to transistor pairs 224 and 226. As noted above, each of DACs 250 and 258 provides only a single analog output. Thus, the Ch-0B output of DAC 250 is connected to the input of transistor 228 and the Ch-4A output of DAC 258 is connected to the input of transistor 242. The allocation of the respective outputs of each DAC to different output transistor pairs and, hence, different driving circuit outputs, enables a physical layout in which the signal paths for upper and lower voltage range driving voltages that can be applied to each pixel are substantially equal in length.

Each of the dual channel DACs is coupled to receive a channel A/channel B (A/B) channel selecting toggle signal. Each DAC is constructed to be responsive to the digital input value and A/B toggle signal applied thereto to alternately provide on it's a and B channel outputs the analog version of the digital input value and a non-passing voltage. The identity of which of the A and B channel outputs provides the analog version and which provides the non-passing voltage is determined by the A/B toggle signal. As a result, when the A/B toggle signal is toggled between values of "0" and "1", the analog version and non-passing voltage produced by the DAC are alternately provided on the A and B channel outputs responsive to the toggling of the toggle signal.

Figure 3:
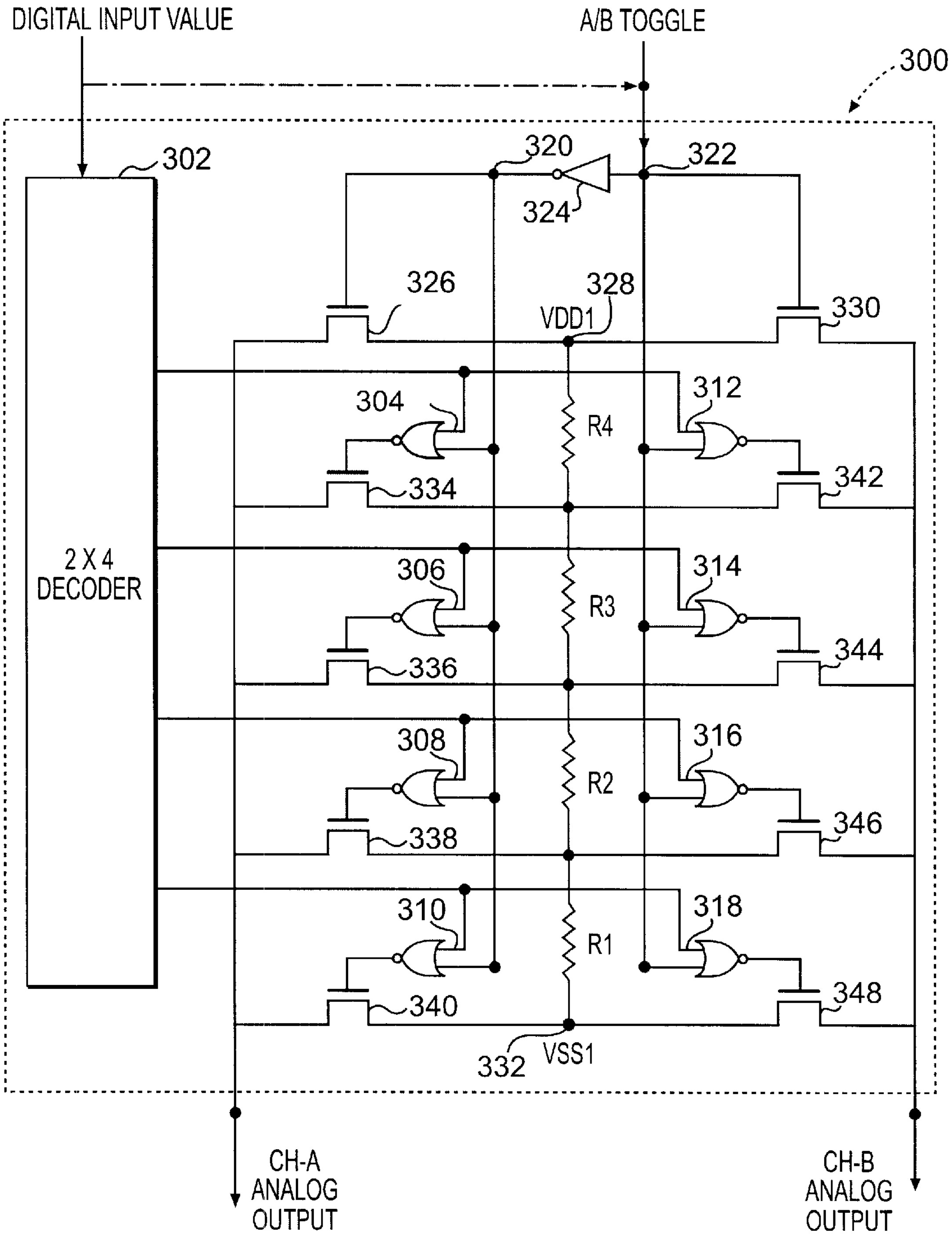
FIG. 3 illustrates an embodiment of a dual channel digital-to-analog converter (DAC) suitable for use in the driving circuit in FIG. 2.

FIG. 3 illustrates a dual channel DAC 300 suitable for use as any of DACs 250–258. DAC 300 is illustrated for the voltage range corresponding to one of the low voltage DACs 250, 254, or 258, however, its structure can be modified for the voltage range corresponding to DACs 252 or 256. DAC 300 includes a decoder 302 coupled to receive a digital input value such as DATA-0, DATA-2, or DATA-4. To simplify explanation, DAC 300 is illustrated for processing the digital input value provided as a two-bit digital value. Decoder 302 decodes the input into a four-bit value. The four decoded bits are respectively applied to first inputs of NOR gates 304, 306, 308, and 310 of a channel A portion of DAC 300 and to first inputs of NOR gates 312, 314, 316, and 318 of a channel B portion of DAC 300. The second input of each of NOR gates 304–310 is coupled to a node 320. The second input of each of NOR gates 312–318 is coupled to a node 322. DAC 300 is coupled to receive the A/B toggle signal at node 322. As diagrammatically shown in FIG. 3, the A/B toggle signal can also be provided as one bit, e.g., the most significant bit of the inputted digital value, with that bit applied as the toggle signal instead of to decoder 302.

An inverter 324 is connected between nodes 320 and 322 to receive on its input the logic value at node 322, so that the complement of the A/B toggle signal is provided at node 320. An "A" channel shunting transistor 326 is coupled between supply voltage VDD1 provided at a node 328 and the A-channel output. The gate of transistor 326 is connected to node 320. A "B" channel shunting transistor 330 is coupled between node 328 and the B-channel output. The gate of transistor 330 is connected to node 322.

The outputs of NOR gates 304–310 are respectively connected to the gates of NMOS transistors 334, 336, 338, and 340. The outputs of NOR gates 312–318 are respectively connected to the gates of NMOS transistors 342, 344, 346, and 348.

Resistors R1–R4 are connected in series between node 328 and a node 332 to which supply voltage VSS1 is applied. Each of transistors 334–340 is coupled between the A-channel output and a different point along the series connected resistors. Each of transistors 342–348 is coupled between the B-channel output and a different point along the series connected resistors. The connection points between the resistors thus serves as an array of analog voltage nodes.

In the operation of DAC 300, if the A/B toggle signal has a value "1", the NOR gates 312–318 each have a logic value "0" output and each of transistors 342–348 is thereby rendered nonconductive. However, shunting transistor 330 is rendered conductive by the logic value "1" applied to its gate so that DAC 300 outputs voltage VDD1, a non-passing voltage, on the channel B output. Due to the logic operation of inverter 324, each of NOR gates 304–310 receives a logic value "0" on the input connected to node 320. Therefore, the outputs of NOR gates 304–310 are determined by the four decoded bits which selectively cause one of these NOR gates to output the logic value "1" to turn on its associated transistor and connect a voltage along the series connected resistors to the channel A output. The values of resistors R1–R4 are selected so that when connected between voltages VDD1 and VSS1, the voltage selected along the series connected resistors and output on the DAC output corresponds to the digital input value.

Similarly, when the A/B toggle signal has a logic value "0", the NOR gates 304–310 each receive the logic "1" output by inverter 324 and output a logic value "0" so that transistors 334–340 are non-conductive. Shunting transistor 326 is turned on by the logic value "1" applied to its gate so that DAC 300 outputs voltage VDD1, a non-passing voltage, on the channel A output. The logic value "0" toggle signal applied to NOR gates 312–318 results in the outputs of these NOR gates being determined by the four decoded bits. As a result, one of transistors 342–348 is turned on and connects a voltage along the series connected resistors, corresponding to the digital input value, to the channel B output.

Thus, as the A/B toggle signal is toggled between logic values "0" and "1", DAC 300 alternates outputting the non-passing voltage and analog value corresponding to the digital input value, on the channel A and channel B outputs.

Figure 4:
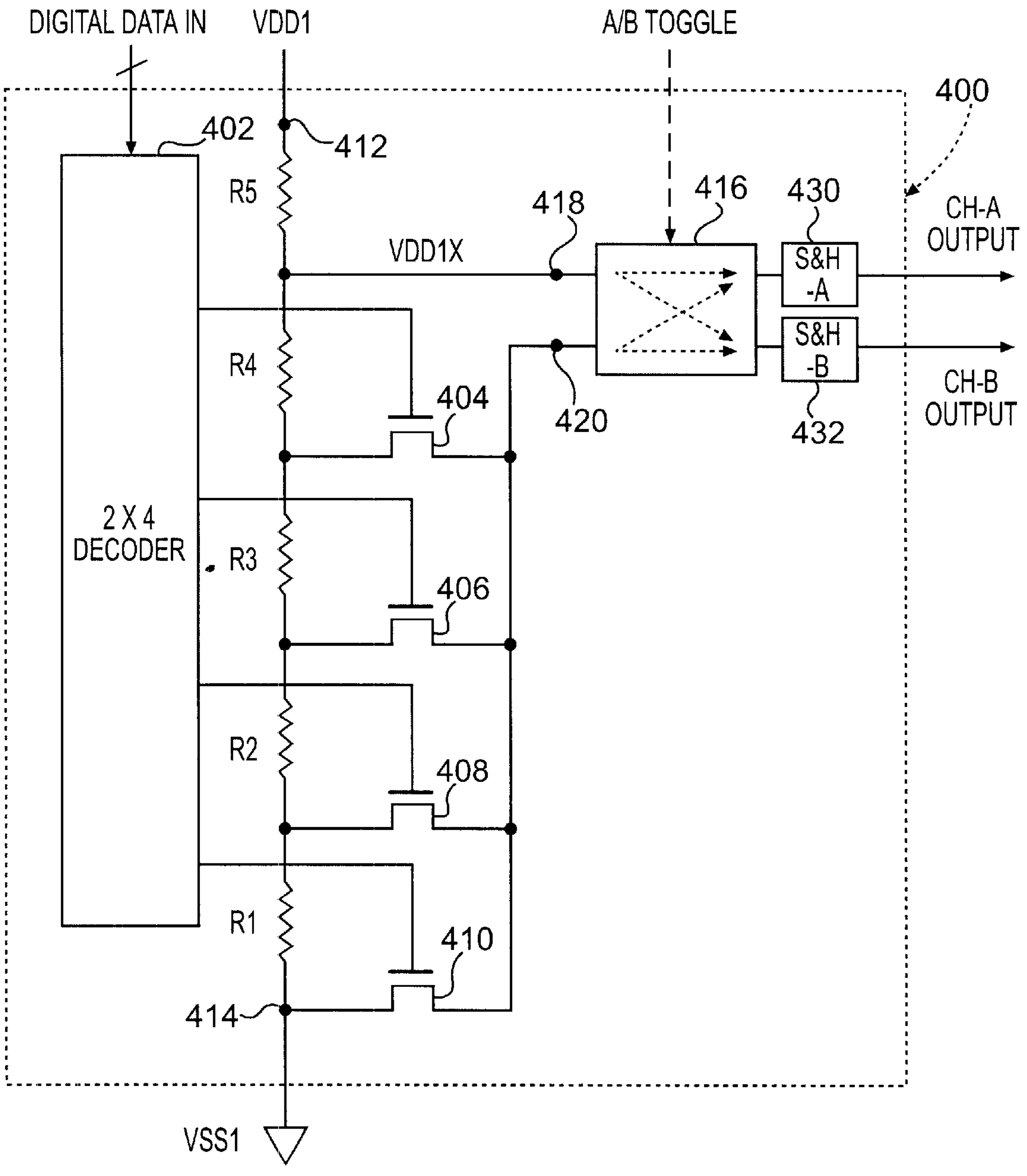
FIG. 4 illustrates another embodiment of a dual channel DAC suitable for use in the driving circuit in FIG. 2.

FIG. 4 illustrates a dual channel DAC 400 that is also suitable for use as any of DACs 250–258. Like DAC 300, DAC 400 is illustrated for use in the lower voltage range, however, the same structure could be used for the upper voltage range with appropriate signal level shifting. DAC 400 includes a decoder 402 that is substantially the same as decoder 302 and is coupled to receive a digital input value, such as DATA-0, DATA-2, or DATA-4, corresponding to a driving voltage magnitude in the lower voltage range. The four decoded bits of DAC 402 are respectively applied to the gate terminals of NMOS transistors 404, 406, 408, and 410.

Resistors R1–R5 are connected in series between a node 412 to which voltage VDD1 is applied and a node 414 to which voltage VSS1 is applied. The connection points between the respective resistors serve as an array of analog voltage nodes. DAC 400 also includes a selection circuit 416 having two inputs 418 and 420 and two outputs serving as a channel A output and a channel B output of DAC 400. Selection circuit 416 is connected to receive the A/B toggle signal and constructed to provide on the channel A and channel B outputs the signals on inputs 418 and 420, respectively, or on inputs 420 and 418, respectively, depending on whether the toggle signal has logic value "0" or "1", respectively. Circuit 416 can be provided as a multiplexer.

Each of transistors 404–410 is coupled between input 420 of selection circuit 416 and a different point along the series connected resistors. Input 418 can optionally be coupled to a point between resistors R4 and R5 where a non-passing voltage VDD1X is provided. While, in DAC 300, voltage VDD1 was provided as the non-passing voltage, the provision of resistor R5 in DAC 400 enables provision of VDD1X at a lower value than VDD1. Thus, the value of R5 is selected to fix an appropriate value, e.g. VDD1–0.5 volts, for VDD1X, or R5 is not provided, i.e., R5=0 Ω, so that VDDIX=VDD1.

In the operation of DAC 400, the analog voltage provided on input 420 is determined by one of the decoded NMOS transistors 404–410 that is turned on by the output of decoder 402 to connect a voltage along the series connected resistors to input 420. Thus, the analog output voltage corresponding to the digital input value is provided on input 420 and output on the channel A or channel B output depending on whether the A/B toggle signal has the logic value "1" or "0", respectively. In addition, the non-passing voltage VDD1X can be provided on the channel A or channel B output depending on whether the A/B toggle signal has the logic value "0" or "1", respectively.

Optionally, sample and hold circuits 430 (designated "S&H-A") and 432 (designated "S&H-B") can be coupled between selection circuit 416 and the channel A and B outputs to stabilize and increase the driving strength at the outputs.

Referring again to FIG. 2, in the operation of driving circuit 200, digital input values DATA-1-DATA-4 corresponding to driving voltage magnitudes to be applied to pixels 204–210 are applied to DACs 250–258 during each operating display cycle of LCD 202. The A/B toggle signal is also applied to DACs 250–258 and switched between logic values "0" and "1" in synchronism with the display cycles of LCD 202. As a result, when the A/B toggle signal has a logic value "0", DACs 250–258 each output a non-passing voltage on the channel A output and the analog output corresponding to the digital input value on the channel B output. In this condition, the analog low driving voltage channel B outputs of DACs 250 and 254 are conducted by transistors 228 and 236, respectively, to drive pixels 204 and 208. Also, the analog high driving voltage channel B outputs of DACs 252 and 256 are conducted by transistors 232 and 240, respectively, to drive pixels 206 and 210. At the same time, transistors 230, 234, 238, and 242 can be rendered non-conductive by the non-passing voltage on each of the channel A outputs.

When the A/B toggle signal has logic value "1", DACs 250–258 each output a non-passing voltage on the channel B output and the analog voltage corresponding to the digital input value on the channel A output. In this condition, the analog low driving voltage channel A outputs of DACs 254 and 258 are conducted by transistors 234 and 242, respectively, to drive pixels 206 and 210. Also, the analog high driving voltage channel A outputs of DACs 252 and 256 are conducted by transistors 230 and 238, respectively, to drive pixels 204 and 208. At the same time, transistors 228, 232, 236, and 240 can be rendered non-conductive by the non-passing voltage on each of the channel B outputs.

In summary, when the A/B toggle signal is "0", pixels 204 and 208 are driven in the lower voltage range and pixels 206 and 210 are driven in the upper voltage range, and when the A/B toggle signal is "1", pixels 204 and 208 are driven in the upper voltage range and pixels 206 and 210 are driven in the lower voltage range. Thus, each pixel is alternately driven in the high and lower voltage ranges and when the voltage applied to one pixel is in the high or lower voltage range, the voltage applied to each pixel adjacent to that pixel is in the low or upper voltage range, respectively.

Driving circuit 200 realizes the same advantages over conventional driving circuits regarding voltage tolerance. For example, each transistor of the output driving transistor pairs can be constructed for a withstand voltage, e.g., 6 volts, that is less than the maximum voltage of the output voltage range of circuit 200, e.g., 12 volts. In one aspect, circuit 200 does not require any kind of output control circuit for selecting analog voltages for outputting, and therefore operates faster than conventional driving circuits. Further, when implemented with DAC 300, circuit 200 does not include a multiplexer and for this additional reason operates faster than conventional circuits. In another aspect, the use of dual channel DACs each shared between adjacent output transistor pairs enables a physical arrangement of components that provides equal signal path lengths for alternately driving each pixel in the upper and lower voltage ranges. Thus LCD operating speed is not affected by unequal signal path length constraints as in conventional practice.

While the disclosed driving circuit operates with voltage range values VSS1 to VDD1 set at 0 to 6 volts and VSS2 to VDD2 set at 6 to 12 volts, the invention is not so limited. The invention can be practiced with equal effectiveness using other voltage ranges. For example VSS1 to VDD1 can be set at −6 to 0 volts and VSS2 to VDD2 can be set at 0 to 6 volts. Further, VDD1 and VSS2 need not be equal.

While an embodiment of a driving circuit including dual channel DACs has been disclosed, the present invention is not so limited. The construction of either of dual channel DACs 300 and 400 can be modified to provide a multichannel DAC having more than two channels. This includes construction of a driving circuit in which each multichannel DAC provides output signals for more than two outputs. Alternatively, each dual channel or multichannel DAC can be constructed from multiple single channel DACS. Further, the driving circuit can be applied to drive different types of loads other than a column or an array of LCD pixels.

It will be apparent to those skilled in the art that various modifications and variations can be made in the apparatus and method of the present invention without departing from the spirit or scope of the invention. Thus, it is intended that the present invention cover the modifications and variations of this invention provided they come within the scope of the appended claims and they equivalents.

What is claimed is:

1. A driving circuit for outputting driving signals from an array of digital-to-analog converters to an array of output terminals, comprising:

first and second output terminals;

a first digital-to-analog converter (DAC) for outputting analog voltages in a first voltage range;

a second DAC for outputting analog voltages in a second voltage range; and a third DAC for outputting analog voltages in said second voltage range; wherein said first and second output terminals are coupled to receive a first analog voltage from said first DAC and a second analog voltage from said second DAC, respectively, during a first time cycle, and said first and second output terminals are coupled to receive a third analog voltage from said third DAC and a fourth analog voltage from said first DAC, respectively, during a second time cycle.

2. The driving circuit of claim 1, further comprising:

a first gating circuit coupled between said first DAC and said first output terminal, said first gating circuit coupled to said first DAC through a first conducting channel; and a second gating circuit coupled between said first DAC and said second output terminal, said second gating circuit coupled to said first DAC through a second conducting channel.

3. The driving circuit of claim 2, wherein said first and second conducting channels have substantially equal routing lengths.

4. The driving circuit of claim 2, wherein:

said first DAC outputs said first analog voltage on said first conducting channel for passing through said first gating circuit during said first time cycle; and said first DAC outputs said fourth analog voltage on said second conducting channel for passing through said second gating circuit during said second time cycle.

5. The driving circuit of claim 2, wherein said first DAC outputs a non-passing analog voltage on said second conducting channel during said first time cycle, and outputs a non-passing analog voltage on said first conducting channel during said second time cycle.

6. The driving circuit of claim 5, wherein said first DAC outputs a passing analog voltage on the first conducting channel and a non-passing voltage at the second conducting channel in one time cycle, and outputs a non-passing analog voltage on the first conducting channel and a passing voltage on the second conducting channel in another time cycle, based on a toggle signal.

7. The driving circuit of claim 2, wherein:

said first gating circuit includes a first MOS transistor; and said second gating circuit includes a second MOS transistor.

8. The driving circuit of claim 7, wherein a gate of said first MOS transistor is coupled to receive a first predetermined voltage, the first MOS transistor being non-conductive when a non-passing voltage is output by said first DAC.

9. The driving circuit of claim 7, wherein:

said first and second MOS transistors are both PMOS transistors; and said first voltage range being higher than said second voltage range.

10. The driving circuit of claim 7, wherein:

said first and second MOS transistors are both NMOS transistors; and said first voltage range being lower than said second voltage range.

11. The driving circuit of claim 1, wherein said output terminals are adapted for coupling to drive an array of liquid crystal display pixels.

12. The driving circuit of claim 1, wherein said output terminals are adapted for coupling to drive an array of liquid crystal display columns.

13. The driving circuit of claim 1, wherein said first time cycle and said second time cycle alternate during operation of the driving circuit.

14. The driving circuit of claim 1, wherein said first time cycle and said second time cycle alternate successively based on a toggle signal applied to said array of DACs.

15. A driving circuit for outputting driving signals from an array of digital-to-analog converters to an array of output terminals in response to a toggle signal, comprising:

a first output terminal;

a second output terminal;

a first digital-to-analog converter (first DAC) for outputting analog voltages in a first voltage range;

a second DAC for outputting analog voltages in a second voltage range;

a third DAC for outputting analog voltages in said second voltage range;

a first gating circuit coupled between said first DAC and said first output terminal; and a second gating circuit coupled between said first DAC and said second output terminal;

wherein said first gating circuit is coupled to said first DAC through a first conducting channel, said second gating circuit is coupled to said first DAC through a second conducting channel, said first DAC outputs a first analog voltage to said first output terminal, and said second DAC outputs to a second analog voltage to said second output terminal, in response to the toggle signal being in a first state, and said third DAC outputs a third analog voltage to said first output terminal, and said first DAC outputs to a fourth analog voltage to said second output terminal, in response to the toggle signal being in a second state.

16. The driving circuit of claim 15, wherein said first and second conducting channels have substantially the same routable length for distances between said first gating circuit and said first DAC, and between said second gating circuit and said second DAC.

17. The driving circuit of claim 15, wherein:

said first DAC outputs said first analog voltage on said first conducting channel for passing through said first gating circuit, and outputs a non-passing analog voltage on said second conducting channel, in response to said toggle signal being in the first state; and said first DAC outputs said fourth analog voltage on said second conducting channel for passing through said second gating circuit, and outputs a non-passing analog voltage on said first conducting channel, in response to said toggle signal being in the second state.

18. A method for outputting an array of alternating high-range and low-range driving signals from an array of digital-to-analog converters (DACS) to an array of output terminals including at least first and second output terminals, comprising:

defining successive alternating first and second time cycles;

outputting, during the first time cycle, a first analog voltage in a first voltage range from a first DAC of the array of DACs to the first output terminal;

outputting, during the first time cycle, a second analog voltage in a second voltage range from a second DAC of the array of DACs to the second output terminal;

outputting, during the second time cycle, a third analog voltage in the second range from a third DAC of the array of DACs to the first output terminal; and outputting, during the second time cycle, a fourth analog voltage in the first range from the first DAC to the second output terminal.

19. The method of claim 18, further comprising:

outputting, during the second time cycle, a fifth analog voltage in the second voltage range from the second DAC to a third output terminal.

20. The method of claim 18, further comprising:

outputting, during the first time cycle, the first analog voltage from a first channel of the first DAC to the first output terminal, and outputting the second analog voltage from a first channel of the second DAC to the second output terminal; and outputting, during the second time cycle, the third analog voltage from a second channel of the third DAC to the first output terminal, and outputting the fourth analog voltage from a second channel of the first DAC to the second output terminal.

21. The method of claim 18, further comprising:

providing an array of gating circuits between said array of DACs and said array of output terminals;

outputting, during the first time cycle, a non-passing analog voltage from the first DAC to the second output terminal; and outputting, during the second time cycle, a non-passing analog voltage from the first DAC to the first output terminal.

22. A driving circuit for outputting a driving signal that alternates between upper and lower voltage ranges, comprising:

a first digital-to-analog converter (DAC) for receiving a first digital input value corresponding to the lower voltage range or a first digital non-passing value corresponding to a non-passing voltage;

a second DAC for receiving a second digital input signal corresponding to the upper voltage range or a second digital non-passing value corresponding to a non-passing voltage;

an output terminal;

a first MOS transistor coupled between an analog output of the first DAC and the output terminal, a gate of the first MOS transistor coupled to receive a first predetermined voltage, the first MOS transistor being nonconductive when the non-passing voltage is output by the first DAC; and a second MOS transistor coupled between an analog output of the second DAC and the output terminal, a gate of the second MOS transistor coupled to receive a second predetermined voltage, the second MOS transistor being nonconductive when the non-passing voltage is output by the second DAC;

wherein in a first operating cycle the first DAC receives the first digital input and the second DAC receives the digital non-passing voltage and in a second operating cycle the first DAC receives the digital non-passing voltage and the second DAC receives the second digital value, so that the driving circuit outputs on the output terminal in the first and second operating cycles an analog voltage in the lower voltage range and an analog voltage in the upper voltage range.

23. The driving circuit of claim 22, wherein the lower voltage range ranges from a high voltage of V1 to a low voltage of V2, and the upper voltage range ranges from a high voltage V3 to a low voltage V4.

24. The driving circuit of claim 23, wherein the first MOS transistor has a first threshold voltage VT1 and is substantially nonconductive when the first digital-to-analog converter output has a magnitude of V1−VT1 or greater; and wherein the second MOS transistor has a second threshold voltage VT2 and is substantially nonconductive when the second digital-to-analog converter output has a magnitude V4+|VT2| or less.

25. The driving circuit of claim 24, wherein the first MOS transistor is substantially nonconductive when the first digital-to-analog converter output is approximately equal to V1−VT1; and the second MOS transistor is substantially nonconductive when the second digital-to-analog converter output is approximately equal to V4+|VT2|.

26. The driving circuit of claim 22, wherein the first MOS transistor is an NMOS transistor, and the second MOS transistor is a PMOS transistor.

27. The driving circuit of claim 23, wherein the first predetermined voltage is V1 and the second predetermined voltage is V4.

28. The driving circuit of claim 22, wherein the first predetermined voltage is substantially equal to the second predetermined voltage.

29. The driving circuit of claim 23, wherein the first predetermined voltage is in a range of V1−VT1 to V1+VT1 and the second predetermined voltage is in a range of V4−|VT2| to V4+|VT2|, wherein VT1 and VT2 are the threshold voltages of the first and second MOS transistors, respectively.

30. The driving circuit of claim 23, wherein the first predetermined voltage is in a range of V1±0.5 volts and the second predetermined voltage is in a range of V4±0.5 volts.

31. The driving circuit of claim 23, wherein the first predetermined voltage is in a range of V1±1.5 volts and the second predetermined voltage is in a range of V4±1.5 volts.

32. A driving circuit for alternately outputting first and second driving voltages, comprising:

a first digital-to-analog converter (DAC) for receiving a first digital value corresponding to a lower voltage range and being responsive to a toggle signal and having a first output, the first DAC outputting an analog version of the first digital value as a first analog voltage or a first non-passing voltage on the first output in response to the toggle signal having a first value or a second value, respectively;

a second DAC for receiving a second digital input value corresponding to an upper voltage range and being responsive to the toggle signal and having a second output, the second DAC outputting an analog version of the second digital value as a second analog voltage or a second non-passing voltage on the second output in response to the toggle signal having the second value or the first value, respectively;

an output circuit including an output terminal, a first MOS transistor having a first input and an output coupled to the output terminal, a gate of the first MOS transistor coupled to receive a first predetermined voltage, the first MOS transistor being nonconductive when the first non-passing voltage is applied to the first input, and a second MOS transistor having a second input and an output coupled to the output terminal, a gate of the second MOS transistor coupled to receive a second predetermined voltage, the second MOS transistor being nonconductive when the second non-passing voltage is applied to the second input; and the first input coupled to the first output of the first DAC and the second input coupled to the second output of the second DAC;

wherein when the first DAC receives the first digital value and the second DAC receives the second digital value, the first MOS transistor alternately conducts the first analog voltage and is nonconductive in response to the first non-passing voltage when the toggle signal is switched between the first and second values, respectively, and the second MOS transistor alternately conducts the second analog voltage and is nonconductive in response to the second non-passing voltage when the toggle signal is switched between the second and first values, respectively, so that the output circuit alternately provides on the output terminal the first and second analog voltages.

33. The driving circuit of claim 32, wherein the lower voltage range ranges from a high voltage of V1 to a low voltage of V2, and the upper voltage range ranges from a high voltage V3 to a low voltage V4.

34. The driving circuit of claim 32, wherein the first MOS transistor has a first threshold voltage VT1 and is substantially nonconductive when the first digital-to-analog converter output has a magnitude of V1−VT1 or greater; and wherein the second MOS transistor has a second threshold voltage VT2 and is substantially nonconductive when the second digital-to-analog converter output has a magnitude of V4+|VT2| or less.

35. The driving circuit of claim 34, wherein the first MOS transistor is substantially nonconductive when the first digital-to-analog converter output has a magnitude approximately equal to V1−VT1; and the second MOS transistor is substantially nonconductive when the second digital-to-analog converter output has a magnitude approximately equal to V4+|VT2|.

36. The driving circuit of claim 32, wherein the first MOS transistor is an NMOS transistor, and the second MOS transistor is a PMOS transistor.

37. The driving circuit of claim 33, wherein the first predetermined voltage is V1 and the second predetermined voltage is V4.

38. The driving circuit of claim 32, wherein the first predetermined voltage is substantially equal to the second predetermined voltage.

39. The driving circuit of claim 33, wherein the first predetermined voltage is in a range of V1−VT1 to V1+VT1 and the second predetermined voltage is in a range of V4−|VT2| to V4+|VT2|, wherein VT1 and VT2 are the threshold voltages of the first and second MOS transistors, respectively.

40. The driving circuit of claim 33, wherein the first predetermined voltage is in a range of V1±0.5 volts and the second predetermined voltage is in a range of V4±0.5 volts.

41. The driving circuit of claim 33, wherein the first predetermined voltage is in a range of V1±1.5 volts and the second predetermined voltage is in a range of V4±1.5 volts.

42. A method for outputting a driving signal that alternates between upper and lower voltage ranges, comprising:

receiving at a first digital-to-analog converter (DAC), in a first of successive operating cycles, a first digital input value and in response outputting an analog voltage in the lower voltage range and, in a second of the successive operating cycles, receiving at the first DAC a first digital non-passing value and in response outputting a first analog non-passing voltage;

receiving at a second DAC, in the second operating cycle, a second digital input signal and in response outputting an analog voltage in the upper voltage range and, in the first operating cycle, receiving at the second DAC a second digital non-passing value and in response outputting a second analog non-passing voltage;

applying a first predetermined voltage to a gate of a first MOS transistor, the first MOS transistor being nonconductive when the first non-passing voltage is output by the first DAC and conducting the lower voltage range analog voltage when output by the first DAC;

applying a second predetermined voltage to a gate of a second MOS transistor, the second MOS transistor being nonconductive when the second non-passing voltage is output by the second DAC and conducting the upper voltage range analog voltage when output by the second DAC; and providing in succession on the first and second operating cycles, on an output terminal to which both the first and second MOS transistors are coupled, the lower and upper voltage range analog voltages, respectively.

43. A method for alternately outputting first and second driving voltages, comprising:

receiving at a first digital-to-analog converter (DAC) a first digital value corresponding to a lower voltage range and a toggle signal;

outputting the toggle signal as alternating between first and second values;

outputting from the first DAC an analog version of the first digital value as a first analog voltage and a first non-passing voltage on first and second outputs of the first DAC, respectively, or on the second and first outputs, respectively, in response to the toggle signal having the first or second value, respectively;

receiving at a second DAC a second digital input value corresponding to an upper voltage range and coupling the second DAC to be responsive to the toggle signal;

outputting from the second DAC an analog version of the second digital value as a second analog voltage and a second non-passing voltage on first and second outputs of the second DAC, respectively, or on the second and first outputs of the second DAC, respectively, in response to the toggle signal having the first value or the second value, respectively;

alternately conducting the first analog voltage through a first MOS transistor and rendering the first MOS transistor nonconductive in response to the first non-passing voltage when the toggle signal is switched between the second and first values, respectively;

alternately conducting the second analog voltage through a second MOS transistor and rendering the second MOS transistor nonconductive in response to the second non-passing voltage when the toggle signal is switched between the first and second values, respectively; and alternately providing on an output terminal the first and second analog voltages.

44. The method of claim 43, further comprising:

applying a first predetermined voltage to a gate of a first MOS transistor, the first MOS transistor being nonconductive when the first DAC outputs the first non-passing voltage; and applying a second predetermined voltage to a gate of a second MOS transistor, the second MOS transistor being nonconductive when the second DAC outputs the second non-passing voltage.

45. A digital-to-analog converter for converting into an analog output a digital input value, comprising:

a decoder for receiving the digital input value and providing decoded bits;

first and second sets of logic gates respectively coupled to receive the decoded bits on a first input;

a first set of output transistors each having a conductive state controlled by an output of a corresponding one of the first set of logic gates;

a second set of output transistors each having a conductive state controlled by an output of a corresponding one of the second set of logic gates;

an inverter coupled to receive an externally applied binary signal on its input and provide an inversion of the binary signal on its output;

the first set of logic gates coupled to receive the output of the inverter on a second input;

the second set of logic gates coupled to receive the binary signal on a second input;

an array of analog voltage nodes;

a first output terminal;

a second output terminal;

the first set of output transistors each coupled between the first output terminal and predetermined points along said array of analog voltage nodes;

the second set of output transistors each coupled between the second output terminal and the predetermined points along said array of analog voltage nodes;

a first shunting transistor coupled between a first node for receiving a first power supply voltage and the first output terminal and having a conductive state controlled by the inverter output; and a second shunting transistor coupled between the first node and the second output terminal and having a conductive state controlled by the binary signal.

46. The digital-to-analog converter of claim 45, further comprising:

a plurality of resistors connected in series between first and second nodes for receiving first and second power supply voltages, respectively, so that the plurality of resistors form a voltage divider including said array of analog.

47. The digital-to-analog converter of claim 46, wherein said logic gates are NOR gates.

48. A digital-to-analog converter for converting into an analog output a digital input value, comprising:

a decoder for receiving the digital input value and providing decoded bits;

a set of output transistors each having a conductive state controlled by a different one of the decoded bits;

an array of analog voltage nodes;

a selector circuit having first and second inputs and first and second outputs and coupled to receive a digital control signal, the selector circuit providing on the first and second outputs voltages on the first and second inputs, respectively, or the second and first inputs, respectively, depending on whether the digital signal has a first or second value, respectively;

the set of output transistors each coupled between the first input and said array of analog voltage nodes; and the second input coupled to another node corresponding to a non-passing voltage.

49. The digital-to-analog converted of claim 48, further comprising:

a plurality of resistors connected in series between first and second nodes for receiving first and second power supply voltages, respectively, so that the plurality of resistors form a voltage divider including said array of analog voltage nodes.

* * * * *